(12) United States Patent
Okada

(10) Patent No.: US 7,968,883 B2
(45) Date of Patent: Jun. 28, 2011

(54) IMAGE DETECTOR

(75) Inventor: Yoshihiro Okada, Ashigarakami-gun (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/256,047

(22) Filed: Oct. 22, 2008

(65) Prior Publication Data
US 2009/0101907 A1 Apr. 23, 2009

(30) Foreign Application Priority Data
Oct. 23, 2007 (JP) ................................. 2007-275159

(51) Int. Cl.
  *H01L 23/28* (2006.01)
  *H01L 27/146* (2006.01)
(52) U.S. Cl. .... 257/59; 257/433; 257/787; 257/E31.117
(58) Field of Classification Search .................... 257/59, 257/433, 787, E31.117
See application file for complete search history.

(56) References Cited

U.S. PATENT DOCUMENTS
2002/0131011 A1 * 9/2002 Izumi ............................. 349/199
2003/0096445 A1 * 5/2003 Izumi et al. ...................... 438/68
2006/0033031 A1 * 2/2006 Takeda et al. ............ 250/370.11

FOREIGN PATENT DOCUMENTS
JP  2001-148475 A  5/2001
JP  3737343 B2  11/2005

* cited by examiner

*Primary Examiner* — Ngan Ngo
*Assistant Examiner* — Benjamin Tzu-Hung Liu
(74) *Attorney, Agent, or Firm* — Sughrue Mion, PLLC

(57) ABSTRACT

An image detector which includes an active matrix substrate and a protection substrate bonded to the active matrix substrate by an insulating bonding member, in which the insulating bonding member is bonded to the active matrix substrate through an inorganic insulating film disposed in an area around the periphery of the semiconductor layer.

14 Claims, 9 Drawing Sheets

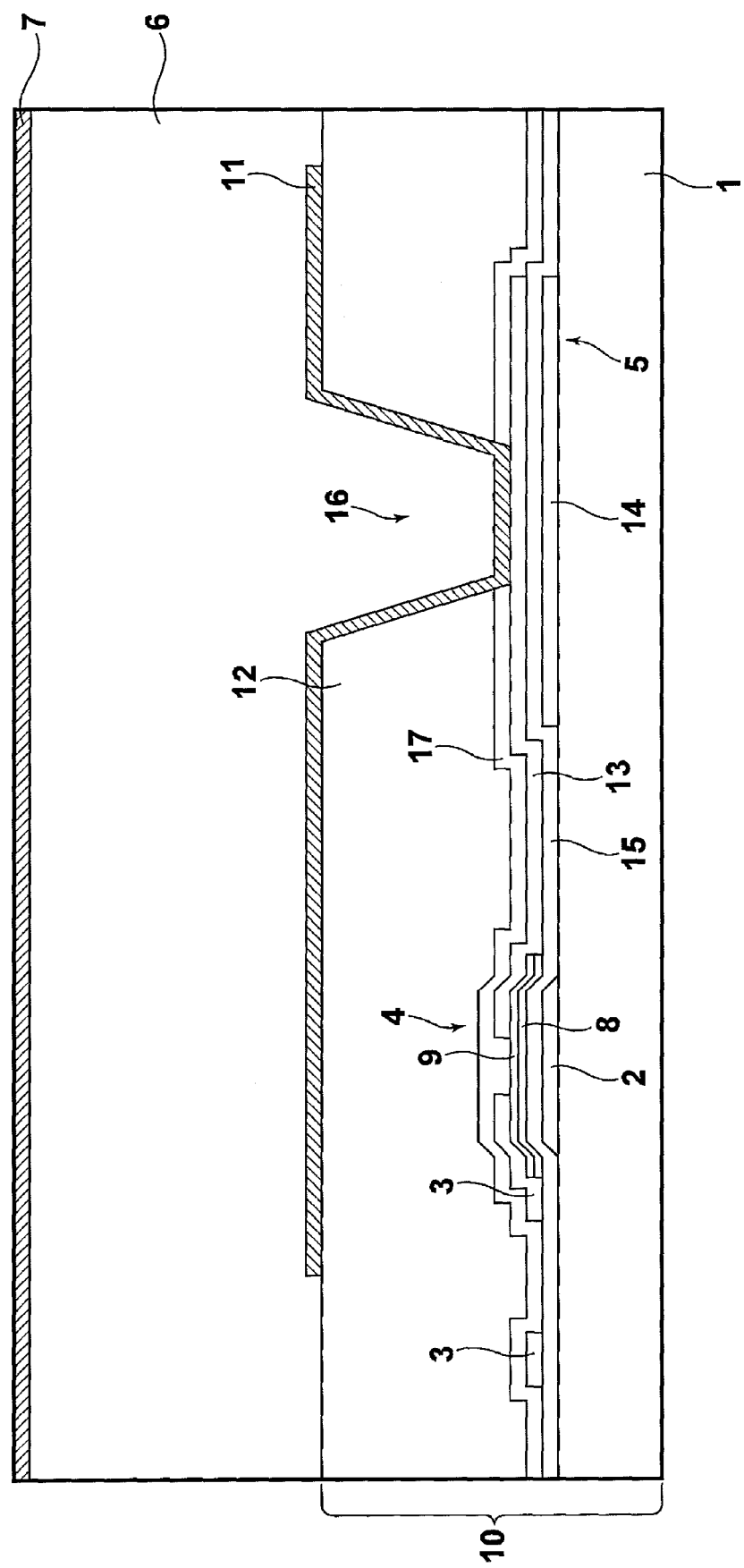

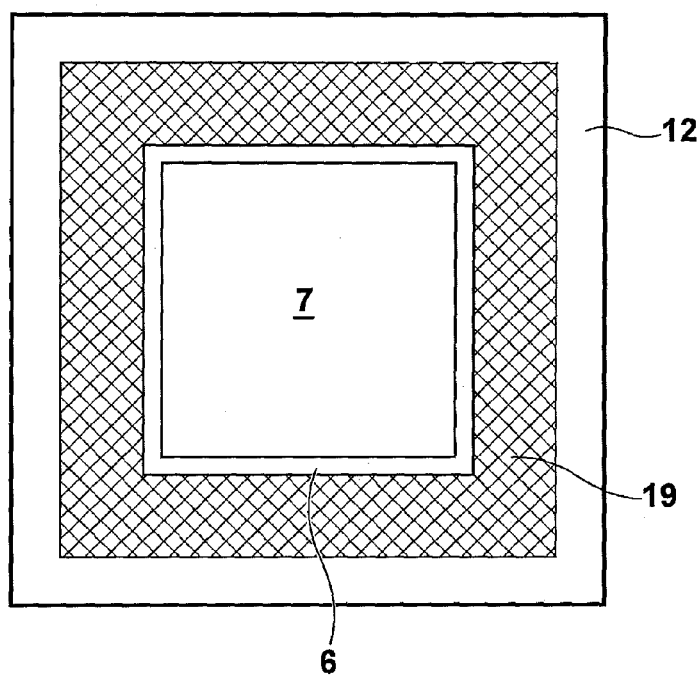
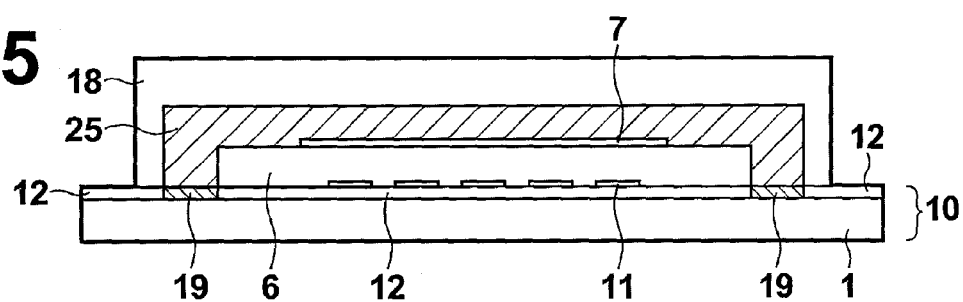
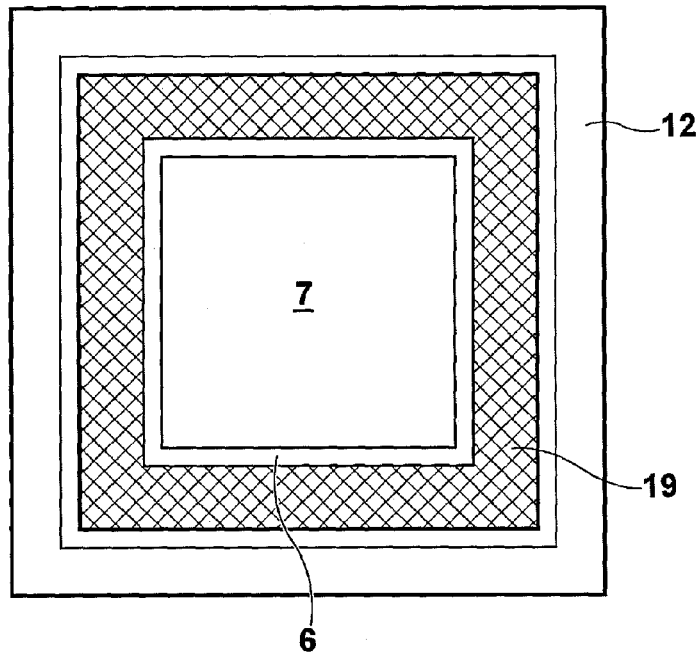

IMAGE DETECTOR

BACKGROUND OF THE INVENTION

1. Field of the Invention

The present invention relates to an image detector having an active matrix substrate with multitudes of switching elements disposed thereon.

2. Description of the Related Art

Recently, a flat panel detector (FPD) has been put into practical use. The FPD includes an active matrix substrate with multitudes of switching elements disposed thereon and an X-ray sensitive layer stacked thereon, and is capable of directly converting X-ray information to digital data. The FPD is advantageous over a conventional imaging plate in that it allows for confirmation of a motion picture, as well as instantaneous confirmation of images.

As one of such FPDs, for example, Japanese Patent No. 3737343 proposes an image detector like that shown in FIG. 17.

The image detector proposed in Japanese Patent No. 3737343 includes a TFT array substrate 100 with multitudes of TFT switches disposed two-dimensionally, a semiconductor layer 116 which generates charges according to an electromagnetic wave incident thereon and is stacked on the TFT array substrate 100 such that the charges are read out by the TFT array substrate 100, an upper electrode 117 stacked on the semiconductor layer 116, and a protection substrate 118 stacked over the semiconductor layer 116 and upper electrode 117 so as to cover them, and a resin material 119 is filled in a space between the semiconductor layer 116/upper electrode 117 and protection substrate 118, as illustrated in FIG. 17.

When image detection is performed using the image detector described in Japanese Patent No. 3737343, a high voltage is applied to the upper electrode 117. This causes creeping discharges to occur from the upper electrode 117 to the wires of the TFT array substrate 100 through the surface of the semiconductor layer 116 which may possibly lead to wire breakages. But, as shown in FIG. 17, the wire breakages may be prevented by covering end portions of the semiconductor layer 116 with the resin material 119.

Where the bonding strength between the resin material 119 and TFT array substrate 100 in the image detector of Japanese Patent No. 3737343 is insufficient, however, a detachment problem arises at the interface between the resin material and TFT array substrate 100 by linear expansion due to temperature change, which will lead to creeping discharges or wire breakages.

Further, in the image detector of Japanese Patent No. 3737343, if detachment occurs between the resin material 119 and TFT array substrate 100, the protection substrate 118 is bonded to the TFT array substrate 100 only with contact surfaces thereof, which may also lead to the detachment of the protection substrate 118 due to lack of the bonding strength.

Generally, it is necessary to provide an organic insulating layer made of an organic material with a thickness of 1 to 2 µm on the TFT array substrate under the charge collection electrodes of the TFT array substrate in order to flatten the deposition surface of the TFT array substrate.

It has been found that, where the uppermost surface of the TFT array substrate is formed of an organic insulating material, the bonding strength between the resin material and organic insulating material is weak, and a detachment problem will eventually arise at the interface between the resin material and TFT array substrate 100 by linear expansion due to temperature change, which will then lead to creeping discharges or wire breakages.

In view of the circumstances described above, it is an object of the present invention to provide an image detector capable of preventing detachment of the resin material from the active matrix substrate.

SUMMARY OF THE INVENTION

An image detector of the present invention includes: an active matrix substrate having a substrate on which multitudes of switching elements are disposed; a semiconductor layer which generates charges according to an electromagnetic wave representing image information irradiated thereon and is stacked on the active matrix substrate such that the charges are read out by the active matrix substrate; a protection substrate disposed opposite to the active matrix substrate; and an insulating bonding member which bonds the protection substrate to the active matrix substrate, in which the insulating bonding member is bonded to the active matrix substrate through an inorganic insulating film disposed in an area around the periphery of the semiconductor layer.

In the image detector of the present invention, the protection substrate may be bonded to the active matrix substrate through an organic insulating film.

Further, the active matrix substrate may include an organic insulating film having a plurality of openings at a bonding area with the insulating bonding member and the inorganic insulating film may be disposed at the openings of the organic insulating film.

Still further, the openings of the organic insulating film may be formed such that a contact area of the insulating bonding member with the inorganic insulating film through the openings corresponds to 20 to 80% of a contact area of the insulating bonding member with the active matrix substrate.

Further, the active matrix substrate may include multitude of signal wires, and an organic insulating film may be provided over the signal wires or an adjacent area thereof, and the inorganic insulating film may be provided in an area other than the area where the organic insulating film is provided.

Still further, a contact area of the insulating bonding member with the inorganic insulating film may corresponds to 20 to 80% of a contact area of the insulating bonding member with the active matrix substrate.

Further, the inorganic insulating film may be a SiNx film.

According to the image detector of the present invention, the insulating bonding member is bonded to the active matrix substrate through the inorganic insulating film disposed in an area around the periphery of the semiconductor layer, so that the adhesiveness between the insulating bonding member and active matrix substrate may be improved. Therefore, detachment of the insulating bonding member due to linear expansion when a temperature change occurs may be prevented, whereby line breakages arising from creeping discharges and the like may be prevented properly. Further, the improvement of the adhesiveness between the insulating bonding member and active matrix substrate allows the protection substrate, which is bonded to the active matrix substrate through the insulating bonding member, to be adequately bonded to the active matrix substrate.

In the image detector of the present invention, the protection substrate and active matrix substrate are temporarily bonded by an adhesive, and where the protection substrate is bonded to the active matrix substrate through an organic insulating film, the influence to the underlayer of the active matrix substrate may be reduced.

Further, where the active matrix includes an organic insulating film having a plurality of openings at the bonding area with the insulating bonding member, and an inorganic insulating film is disposed at the openings of the organic insulating film, the adhesiveness may be further improved by the irregularity produced by the openings in comparison with a case in which an inorganic insulating film is disposed on the entire contact surface of the insulating bonding member with the active matrix substrate.

Still further, where an organic insulating film is provided over the signal wires or an adjacent area thereof of the active matrix substrate, and an inorganic insulating film is provided in an area other than the area where the organic insulating film is provided, voltages impressed on the signal wires by creeping discharges from an upper electrode of the active matrix substrate may be reduced and, at the same time, the adhesiveness between the insulating bonding member and active matrix substrate may be improved.

BRIEF DESCRIPTION OF THE DRAWINGS

FIG. 3 is a cross-sectional view of the radiation image detector, illustrating the structure of one pixel.

FIG. 4 is a top view of the radiation image detector according to the first embodiment, illustrating an area where an inorganic insulating film is provided.

FIG. 5 is a cross-sectional view of a radiation image detector to which is applied a second embodiment of the image detector of the present invention, illustrating a schematic structure thereof.

FIG. 6 is a top view of the radiation image detector according to the second embodiment, illustrating an area where an inorganic insulating film is provided.

DESCRIPTION OF THE PREFERRED EMBODIMENTS

Figure 1:
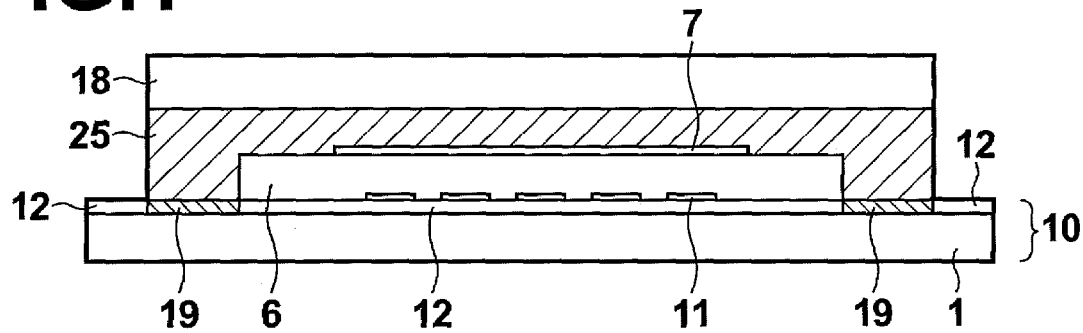
FIG. 1 is a cross-sectional view of a radiation image detector to which is applied a first embodiment of the image detector of the present invention, illustrating a schematic structure thereof.

Hereinafter, a radiation image detector to which is applied a first embodiment of the image detector of the present invention will be described with reference to the accompanying drawings. FIG. 1 illustrates a schematic structure of the radiation image detector.

As illustrated in FIG. 1, the radiation image detector includes a TFT array substrate 10 having a substrate on which multitudes of TFT switches are disposed, a semiconductor layer 6 which generates charges according to an electromagnetic wave representing a radiation image irradiated thereon and is stacked on the TFT array substrate 10 such that the charges are read out by the TFT array substrate 10, an upper electrode 7 stacked on the semiconductor layer 6, an insulating bonding member 25 provided so as to cover a peripheral portion of the semiconductor layer 6 and an upper portion of the upper electrode 7 and to bond a protection substrate 18, to be described later, with the TFT array substrate 10, and the protection substrate 18 stacked on the insulating bonding member 25.

The semiconductor layer 6 generates charges (electrons-holes) therein when irradiated with an electromagnetic wave such as X-ray. That is, the semiconductor layer 6 has electromagnetic wave conductivity and used for converting radiation image information represented by X-ray to charge information. The semiconductor layer 6 is made of, for example, a-Se which is an amorphous body consisting primarily of selenium. Here, the referent of "consisting primarily of selenium" means that the selenium has a content rate of not less than 50%.

The characteristics of the semiconductor layer 6 are liable to be significantly degraded by the environment, so that it requires a certain kind of cover for protection from impurity contamination, moisture, and the like. It also needs to have sufficient voltage resistance since a bias voltage of 1 to 10 kV is applied to the upper electrode 7. Consequently, the protection substrate 18 is provided in the radiation image detector of the present embodiment.

Preferably, the protection substrate 18 is made of the same material and has the same board thickness as the substrate of the TFT array substrate 10. In the radiation image detector of the present embodiment, non-alkali glass with a thickness of 0.7 mm is used.

Then, the insulating bonding member 25 is provided for bonding the protection substrate 18 to the TFT array substrate 10 and preventing creeping discharges between the upper electrode 7 and TFT array substrate 10. The insulating bonding member 25 is made of an epoxy group material.

Figure 2:
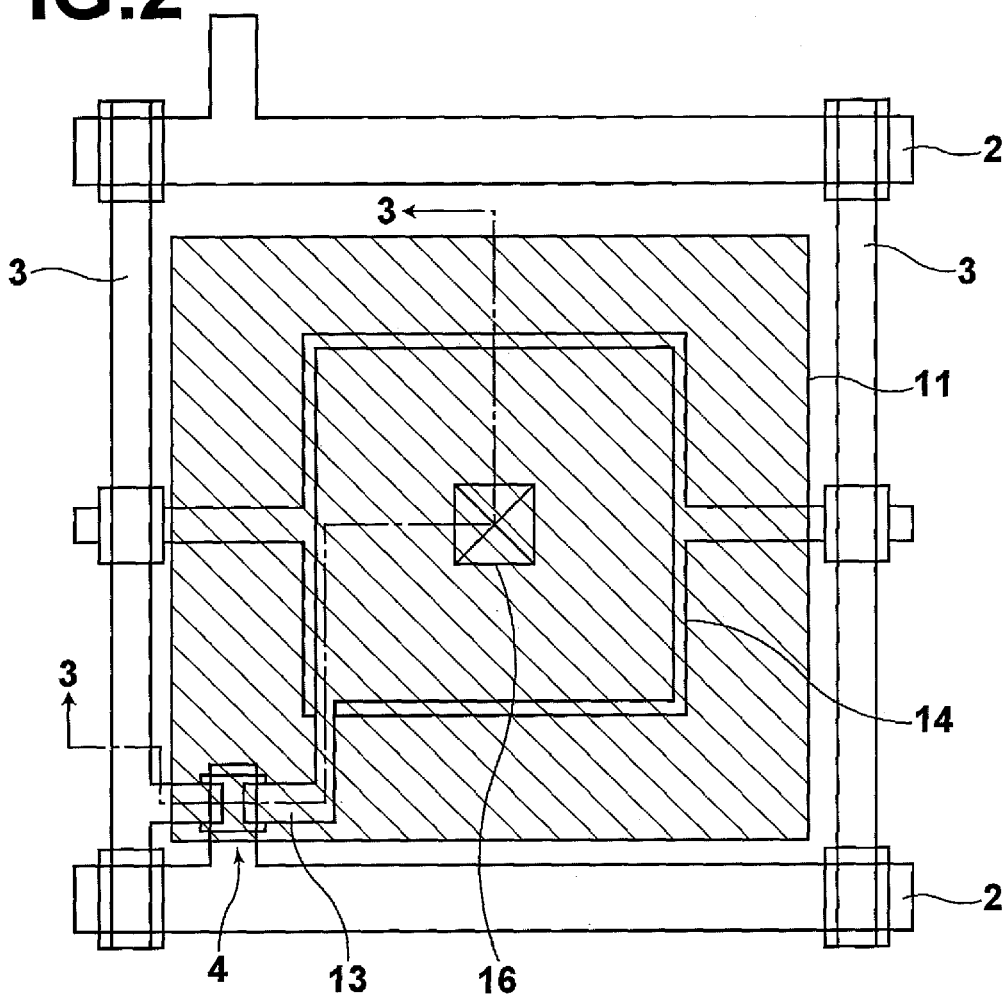
FIG. 2 is a plan view of the radiation image detector, illustrating the structure of one pixel.

The TFT array substrate 10 will now be described in detail with reference to FIGS. 2 and 3. The TFT array substrate 10 includes multitudes of pixels disposed two-dimensionally, each having a TFT switch, but FIG. 2 illustrates a plan view of one pixel, and FIG. 3 is a cross-section taken along the line 3-3 of FIG. 2.

As illustrated in FIG. 3, the TFT array substrate 10 includes a glass substrate 1, a scanning wire 2, a charge storage capacitor electrode (Cs electrode) 14, a gate insulating film 15, a connection electrode 13, a channel layer 8, a contact layer 9, a data wire 3, an insulating protection film 17, an interlayer insulating film 12, and a charge collection electrode 11.

Further, a thin film transistor 4 is formed by the scanning wire 2, gate insulating film 15, data wire 3, connection electrode 13, channel layer 8, contact layer 9, and the like, and a charge storage capacitor (Cs) 5 is formed by the Cs electrode 14, gate insulating film 15, connection electrode 13, and the like.

The glass substrate 1 is a supporting substrate, which is, for example, non-alkali glass.

As illustrated in FIG. 2, the scanning wires 2 and data wires 3 are electrode wires disposed in a grid pattern, and the thin film transistor 4 (TFT switch) is formed adjacent to each of the intersecting points. The TFT switch 4 is a switching element, and the source and drain thereof are connected to the data wire 3 and connection electrode 13 respectively. The data wire 3 is the source electrode and the connection electrode 13 is the drain electrode of the TFT switch 4. That is, the data wire 3 includes a straight portion as a signal wire and an extended portion for forming the TFT switch 4, and the connection wire 13 is provided such that the TFT switch 4 is connected to the charge storage capacitor 5.

The gate insulating film 15 is made of SiNx, SiOx, or the like. The gate insulating film 15 is provided so as to cover the scanning wire 2 and Cs electrode 14, and the portion thereof over the scanning wire 2 acts as the gate insulating film of the TFT switch 4, and the portion thereof over the Cs electrode 14 acts as the dielectric layer of the charge storage capacitor 5. That is, the charge storage capacitor 5 is a superimposed area of the Cs electrode 14 formed in the same layer as the scanning wire 2 and the connection electrode 13. Note that the material of the gate insulating film 15 is not limited to SiNx, SiOx, but an anodized film of scanning wire 2 and Cs electrode 14 may be used in combination therewith.

The channel layer (i layer) 8 is the channel section of the TFT switch 4, and a current path between the data wire 3 and connection electrode 13. The contact layer (n+layer) 9 provides a contact between the data wire 3 and connection electrode 13.

The insulating protection film 17 is formed over the data wire 3 and connection electrode 13, that is, substantially over the entire surface (substantially over the entire area) of the glass substrate 1. This may protects the connection electrode 13 and data wire 3 and provides an electrically insulating separation between them. The insulating protection film 17 has a contact hole 16 at a predetermined position, i.e., the position over the portion of the connection electrode 13 facing the Cs electrode 14 across the capacitor 5.

The charge collection electrode 11 is a transparent conductive amorphous oxide film. The charge collection electrode 11 is formed so as to fill the contact hole 16 and stacked over the data wire 3 and connection electrode 13. The charge collection electrode 11 is in electrical communication with the semiconductor layer 6 so as to be able to collect charges generated in the semiconductor layer 6.

The interlayer insulating film 12 is an organic insulating film and provides an electrically insulating separation for the TFT switch 4. As for the material of the organic insulating film, for example, an acrylic resin may be used. The contact hole runs through the interlayer insulating film 12 and the charge collection electrode 11 is connected to the connection electrode 13.

Here, the interlayer insulating film 12, which is the uppermost layer of the TFT array substrate 10 structured in the manner as described above, is formed of an organic insulating film, as described above. Direct stacking of the insulating bonding member 25 on the interlayer insulating film 12 will result in insufficient bonding strength between the interlayer insulating film 12 formed of an organic insulating film and the insulating bonding member 25, so that the insulating bonding member 25 may detach from the TFT array substrate 10 due to difference in the linear expansion coefficient among the TFT array substrate 10, semiconductor layer 6, and insulating bonding member 25 when a temperature change occurs. This, for example, poses problems of creeping discharges and wire breakages in the scanning wires 2 or data wires 3. Further, the protection substrate 18 bonded to the TFT array substrate 10 through the insulating bonding member 25 may possibly detach therefrom.

Consequently, in the radiation image detector according to the present embodiment, the TFT array substrate 10 and insulating bonding member 25 are bonded through an inorganic insulating film 19, as illustrated in FIG. 1. As for the material of the inorganic insulating film 19, for example, SiNx is preferable but SiOx may also be used. The results of the evaluation conducted by the inventors of the present invention show that the adhesiveness between the insulating bonding member 25 and inorganic insulating film is greater than that between the insulating bonding member 25 and organic insulating film. The evaluation results are shown in Table 1 below. Accordingly, the structure according to the present embodiment may prevent the insulating bonding member 25 from detaching from the TFT array substrate 10. Thus, the structure may also prevent the protection substrate 18 bonded to the TFT array substrate 10 through the insulating bonding member 25 from detaching therefrom.

TABLE 1

| | Protection Substrate/Insulating Bonding member (epoxy)/ TFT Array Adhesiveness | |
|---|---|---|
| Temp. Change Δt (° C.) | Organic Insulating Film (Flattening Film) | Inorganic Insulating Film (SiNx) |
| 5 | ○ | ○ |
| 10 | X | ○ |
| 15 | X | ○ |
| 20 | X | X |

Sample Size: 4×4 cm (with adhesive resin applied on the entire surface)
Protection Substrate: 0.7 mm thickness non-alkali glass
Insulating Bonding Member: 1 mm thickness thermoset epoxy resin
TFT Array Substrate: sample of 0.7 mm thickness non-alkali glass with organic or inorganic insulating film deposited thereon (without TFT array because of evaluation purpose)
Examples of flattening film (or so-called interlayer insulating film) include HSG series of Hitach Chemical Co., Ltd and SOG material, ACCUGLASS of Honeywell Corporation. As for the inorganic insulating film, SiNx produced by plasma CVD method is typical.

FIG. 4 is a top view illustrating the area where the inorganic insulating film 19 is provided. As illustrated in FIG. 4, in the radiation image detector according to the first embodiment, the inorganic insulating film 19 is provided at the entire bonding area of the insulating bonding member 25 to the TFT array substrate 10 and in a manner to enclose the semiconductor layer 6.

Next, a radiation image detector to which is applied a second embodiment of the image detector of the present invention will be described. FIG. 5 is a cross-sectional view of the radiation image detector of the second embodiment.

The radiation image detector according to the second embodiment differs from the radiation image detector according to the first embodiment in the shape of the protection substrate 18. The protection substrate 18 of the radiation image detector of the second embodiment has a box shape as illustrated in FIG. 5, and is provided so as to cover the entire sides and upper surfaces of the semiconductor layer 6 and upper electrode 7. Then, the protection substrate 18 and TFT array substrate 10 are bonded through the interlayer insulating film 12.

Also in the radiation image detector of the second embodiment, an inorganic insulating film 19 is provided at the entire bonding area of the insulating bonding member 25 to the TFT array substrate 10 in order to improve the adhesiveness between the insulating bonding member 25 and TFT array substrate 10. The inorganic insulating film 19 is provided so as to enclose the semiconductor layer 6. FIG. 6 is a top view illustrating the area where the inorganic insulating film 19 is provided.

The other structure of the radiation image detector of the second embodiment is identical to that of the radiation image detector of the first embodiment.

Next, a method of manufacturing the radiation image detector of the second embodiment will be described with reference to FIGS. 7A to 7F.

Figure 7A:
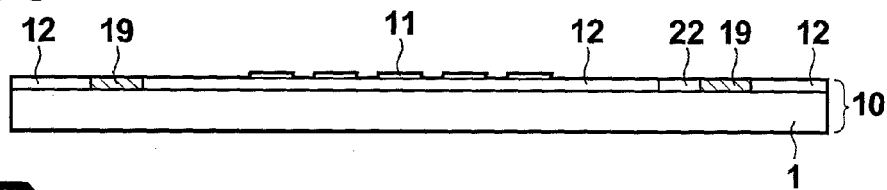
FIGS. 7A to 7F illustrate a method of manufacturing the radiation image detector according to the second embodiment.

First, as illustrated in FIG. 7A, a TFT array substrate 10 is formed. Here, an interlayer insulating film 12 is formed through patterning by photolithography so as not to be formed in an area surround a pixel region where pixels are disposed. Then, an inorganic insulating film 19 is formed in the ring-shaped area where the interlayer insulating film 12 has not been provided. At this time, a metal pattern 22 is also formed.

Figure 7B:
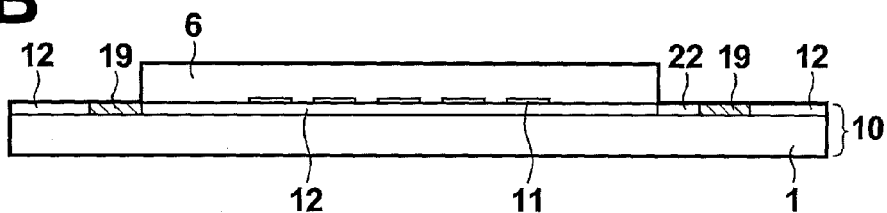

Then, as illustrated in FIG. 7B, a semiconductor layer 6 is formed by depositing a-Se film on the pixel region of the TFT array substrate 10 by vacuum deposition.

Figure 7C:
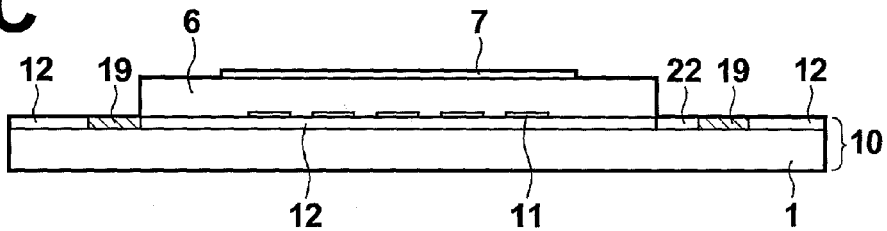

Further, as illustrated in FIG. 7C, an upper electrode 7 is formed by depositing Au on the semiconductor layer 6 by vacuum deposition.

Figure 7D:
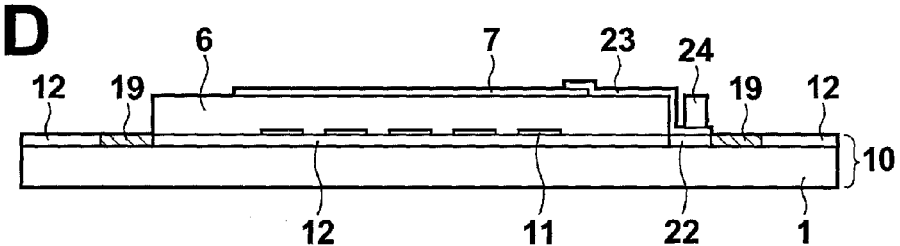

Next, as illustrated in FIG. 7D, an electrode 23 and a terminal 24 for applying a high voltage to the upper electrode 7 are attached. The electrode 23 may be formed of Au deposition film or bonded metal tape.

Figure 7E:
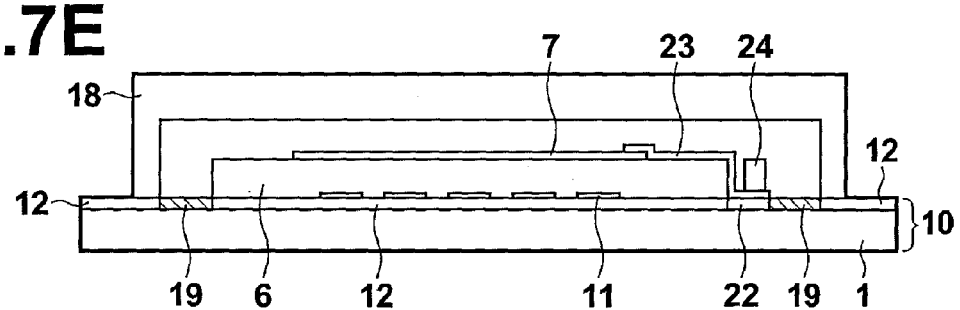
Figure 7F:
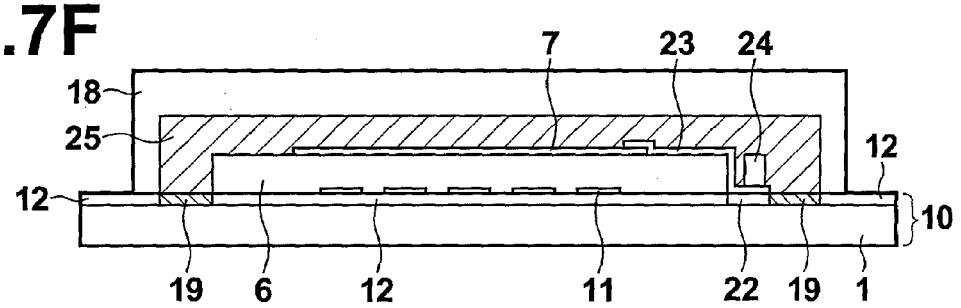

Then, as illustrated in FIG. 7E, a protection substrate 18 is placed on the TFT array substrate 10. Here, the protection substrate 18 is placed on the interlayer insulating film 12 and bonded thereto by an adhesive.

Finally, an insulating bonding member 25 is formed by injecting an epoxy resin from a not shown through-hole provided in the protection substrate 18 to fill the space between the TFT array substrate 10 and protection substrate 18.

In the radiation image detector of the second embodiment, the protection substrate 18 has a box shape, but it is not limited to this and, for example, the side portion of the protection substrate 18 may be formed with a rib member and the upper portion with a plate-like member.

Figure 8:
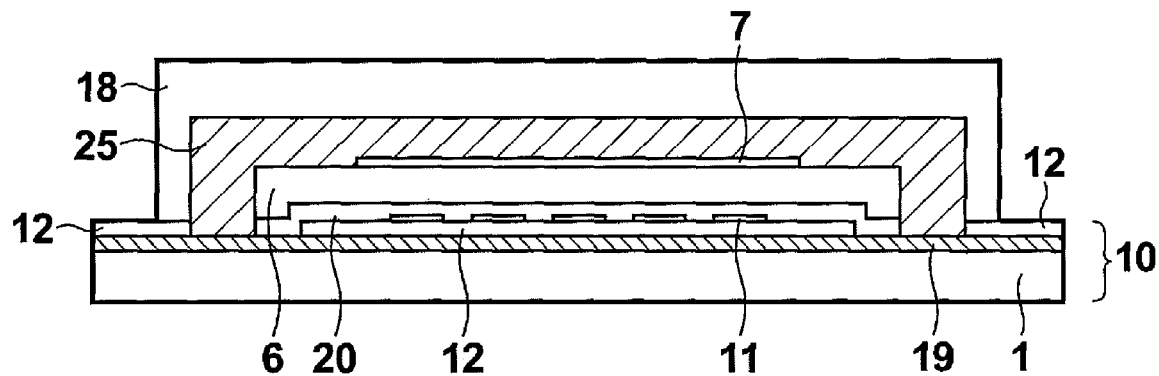
FIG. 8 is a cross-sectional view of a radiation image detector to which is applied a third embodiment of the image detector of the present invention, illustrating a schematic structure thereof.

Next, a radiation image detector to which is applied a third embodiment of the image detector of the present invention will be described. FIG. 8 is a cross-sectional view of the radiation image detector according to the third embodiment.

The radiation image detector according to the third embodiment differs from the radiation image detector according to the second embodiment in that it further includes an underlayer 20 under the semiconductor layer 6. It is often the case that a certain layer is provided under the Se layer for several purposes. One of the purposes is to prevent injection of charges (electrons when positive voltage is applied to the upper electrode, or holes when negative voltage is applied thereto) from the charge collection electrodes. This may reduce noise in the Se layer. Another purpose is to control the film quality of Se film of the upper layer. Generally, the growth of a deposited film is largely influenced by the underlayer, and the characteristics and defects of the deposited film change largely. The results of the evaluation conducted by the inventors of the present invention show that a stable Se layer can be obtained by depositing Se on a $Sb_2S_3$ layer rather than directly depositing on a TFT array substrate.

Where the underlayer 20 is formed using $Sb_2S_3$, as described above, when the bonding section of the underlayer 20 with the TFT array substrate 10 is the interlayer insulating film 12 of an organic insulating film, the adhesiveness between $Sb_2S_3$ and the organic insulating film is low which is likely to cause the detachment problem. The results of the evaluation conducted by the inventors of the present invention show that the adhesiveness between $Sb_2S_3$ and an inorganic insulating film is greater than that between $Sb_2S_3$ and an organic insulating film. The evaluation results are shown in Table 2 below.

TABLE 2

Protection Substrate/Insulating Bonding member (epoxy)/$Sb_2S_3$/ TFT Array Adhesiveness

| Temp. Change Δt (° C.) | Organic Insulating Film (Flattening Film) | Inorganic Insulating Film (SiNx) |
|---|---|---|
| 5 | ○ | ○ |
| 10 | X | ○ |
| 15 | X | ○ |
| 20 | X | X |

Sample Size: 4×4 cm (with adhesive resin/$Sb_2S_3$ deposited on the entire surface)
Protection Substrate: 0.7 mm thickness non-alkali glass
Insulating Bonding Member: 1 mm thickness thermoset epoxy resin
TFT Array Substrate: sample of 0.7 mm thickness non-alkali glass with organic or inorganic insulating film deposited thereon (without TFT array because of evaluation purpose)

In actuality, the $Sb_2S_3$ lies on the entire area under Se layer, but this area requires an organic insulating film so that the inorganic insulating film can not be used. Actual panel evaluation, however, shows that the detachment of the film occurred from a peripheral portion. Consequently, the adhesiveness of the entire panel can be improved by strengthening the adhesiveness in the peripheral portion.

Thus, in the radiation image detector of the third embodiment, the inorganic insulating film 19 is formed on the entire surface of the TFT array substrate 10, and the underlayer 20 is bonded to the TFT array substrate 10 through the inorganic insulating film 19, as illustrated in FIG. 8. By disposing the inorganic insulating film 19 in the manner as described above, the adhesiveness between the underlayer 20 and TFT array substrate 10 may be improved.

Figure 9:
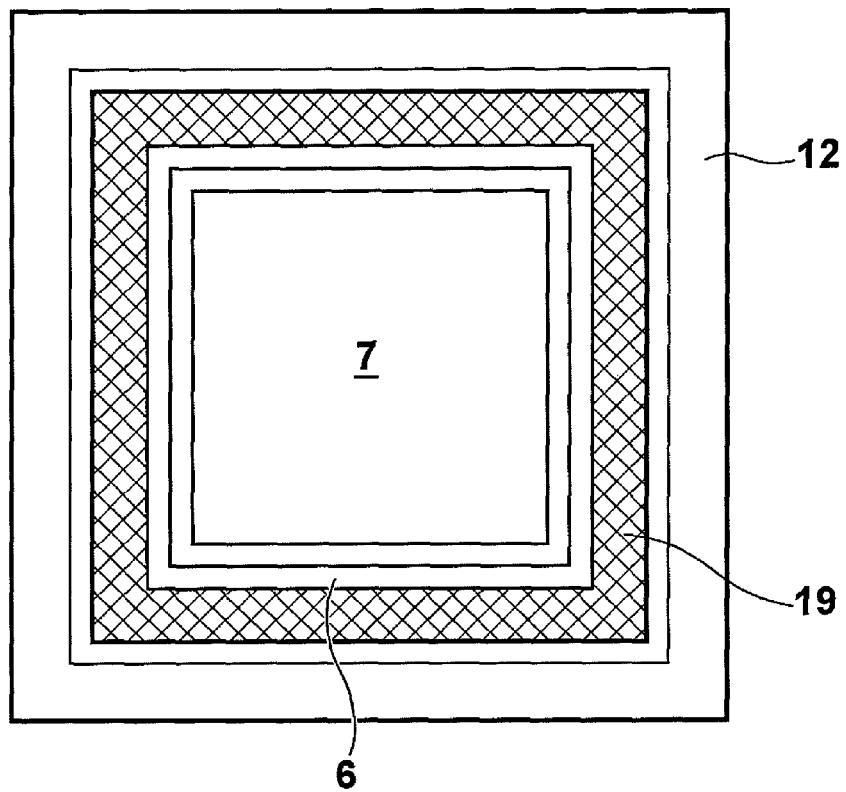
FIG. 9 is a top view of the radiation image detector according to the third embodiment, illustrating a contact area of an inorganic insulating film with an insulating bonding member.

Also in the radiation image detector of the third embodiment, the inorganic insulating film 19 is provided at the entire bonding area of the insulating bonding member 25 to the TFT array substrate 10 in a manner to enclose the semiconductor layer 6 in order to improve the adhesiveness between the insulating bonding member 25 and TFT array substrate 10, as in the second embodiment. FIG. 9 is a top view illustrating the contact area of the inorganic insulating film 19 with the insulating bonding member 25.

As described above, the TFT array substrate 10 of the radiation image detector according to the third embodiment is formed by first forming the inorganic insulating film 19 on the entire surface of the TFT array substrate 10 and then the interlayer insulating film 12 is formed on the inorganic insulating film 19 through patterning by photolithography. The interlayer insulating film 12 is patterned so as not to be formed in an area surrounding the pixel region, and the insulating bonding member 25 and underlayer 20 are provided in the area where the interlayer insulating film 12 has not been formed.

The other structure of the radiation image detector of the third embodiment is identical to that of the radiation image detector of the second embodiment.

Figure 10:
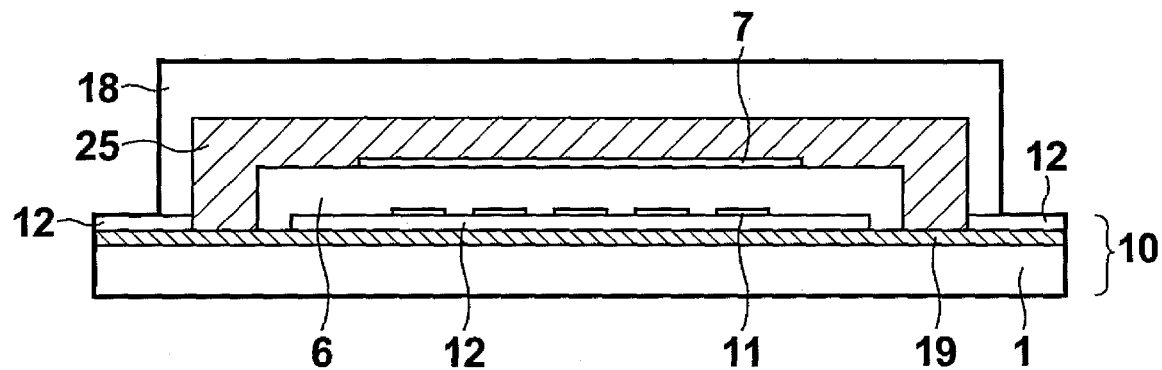
FIG. 10 is a cross-sectional view of a radiation image detector to which is applied a fourth embodiment of the image detector of the present invention, illustrating a schematic structure thereof.

Next, a radiation image detector to which is applied a fourth embodiment of the image detector of the present invention will be described. FIG. 10 is a cross-sectional view of the radiation image detector of the fourth embodiment.

In the radiation image detector according to the fourth embodiment, the inorganic insulating film 19 is formed on the entire surface of the TFT array substrate 10 and then the interlayer insulating film 12 is formed on the inorganic insulating film 19 through patterning, as in the third embodiment, but the patterning method is different from that of the third embodiment.

Figure 11:
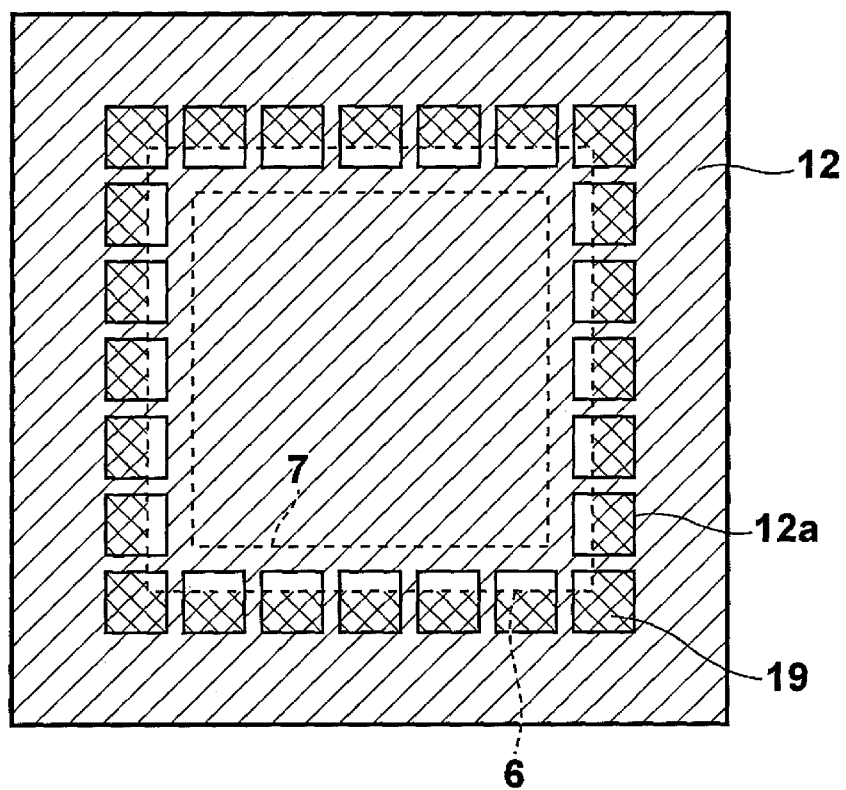
FIG. 11 illustrates an interlayer insulating layer pattern of the TFT array substrate of the radiation image detector according to the fourth embodiment.

FIG. 11 illustrates the pattern of the interlayer insulating film 12 of the TFT array substrate 10 of the radiation image detector according to the fourth embodiment. As illustrated in FIG. 11, the insulating film 12 of the TFT array substrate 10 of the radiation image detector according to the fourth embodiment is patterned such that a plurality of openings 12a is formed around the pixel region of the TFT array substrate 10. In FIG. 11, the areas of the semiconductor layer 6 and upper electrode 7 are denoted by dotted lines.

Patterning of the interlayer insulating film 12 in the manner as described above allows the insulating bonding member 25 to contact the inorganic insulating film 19 through the openings 12a, thereby the adhesiveness between the insulating bonding member 25 and inorganic insulating film 19 may be improved. Note that the portions denoted by grid patterns in FIG. 11 are the areas where the insulating bonding member 25 contacts the inorganic insulating film 19. Preferably, the openings 12a of the interlayer insulating film 12 are formed such that the contact area of the insulating bonding member 25 with the inorganic insulating film 19 through the openings 12a corresponds to 20 to 80%, and more preferably 30 to 80% of the contact area of the insulating bonding member 25 with the TFT array substrate 10.

The interlayer insulating film 12 is as thick as 1 to 3 μm, if the interlayer insulating film 12 is not provided in the entire area surrounding the pixel region of the TFT array substrate 10, as in the radiation image detector of the third embodiment, a large groove with a step of 1 to 3 μm will be formed. Where such large groove is formed, the thickness of the resist film in the photolithography process in fabricating the TFT becomes uneven, resulting in poor patterning of ITO film.

Consequently, the poor patterning may be remedied by providing a plurality of openings 12a in the interlayer insulating film 12 as in the fourth embodiment, instead of not providing the interlayer insulating film 12 in the entire area surrounding the pixel region of the TFT array substrate 10 as in the third embodiment. Further, provision of a deep uneven pattern on the uppermost surface of the TFT array substrate 10 may further improve the bonding strength.

Note that an underlayer may be provided in the radiation image detector of the fourth embodiment, as in the radiation image detector of the third embodiment.

Figure 12:
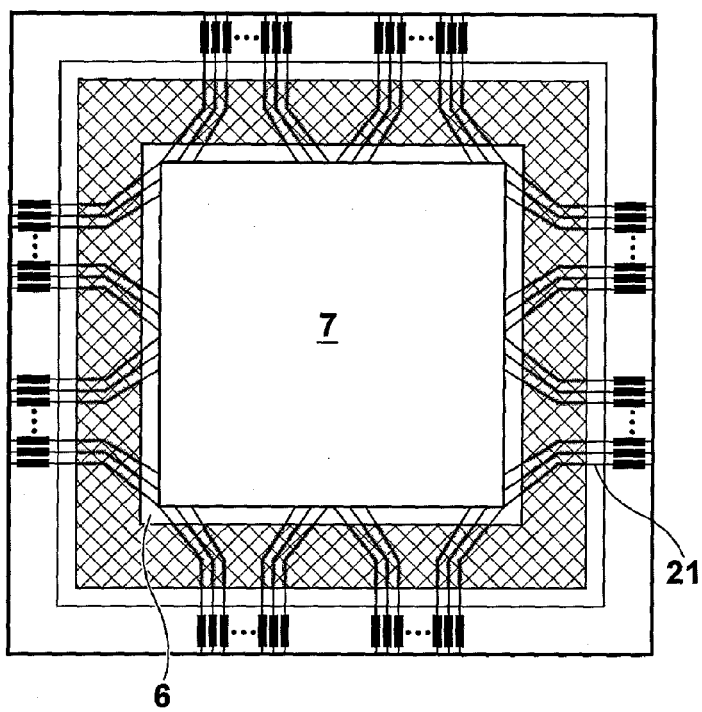
FIG. 12 is a top view of a radiation image detector to which is applied a fifth embodiment of the image detector of the present invention, illustrating a schematic structure thereof.

Next, a radiation image detector to which is applied a fifth embodiment of the image detector of the present invention will be described. FIG. 12 is a top view of the radiation image detector according to the fifth embodiment.

Although not shown in the first to fifth embodiment, wires 21, such as the scanning wires 2 and data wires 3, of the radiation image detector are extended from the pixel region to the four sides in the outside, as illustrated in FIG. 12. A high voltage in the order of several thousands of volts is applied to the upper electrode 7, and although the high voltage is not directly applied to the area where the semiconductor layer 6 is not provided, but several hundreds of volts is impressed between the area and wires 21 by creeping discharge phenomenon or the like. Consequently, in the radiation image detector according to the fifth embodiment, the interlayer insulating film 12 is patterned such that the voltage impressed on the wiring 21 is reduced.

Figure 13:
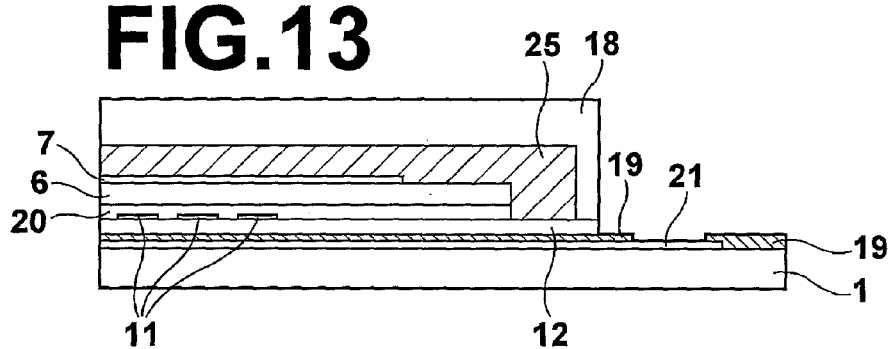
FIG. 13 is a partial cross-sectional view of the radiation image detector according to the fifth embodiment cut out along the wires.
Figure 14:
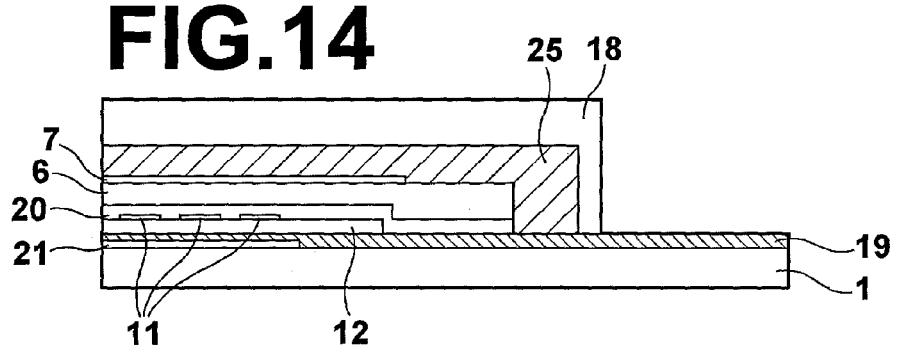
FIG. 14 is a partial cross-sectional view of the radiation image detector according to the fifth embodiment cut out at a position without the wires.

More specifically, a partial cross-sectional view of the radiation image detector according to the fifth embodiment cut out along the wires 21 is shown in FIG. 13, and a partial cross-sectional view of the radiation image detector according to the fifth embodiment cut out at a position without the wires 21 is shown in FIG. 14.

As illustrated in FIGS. 13 and 14, in the TFT array substrate 10 of the radiation image detector according to the fifth embodiment, the wires 21 is formed on the glass substrate 1, then the inorganic insulating film 19 is formed thereon, and the interlayer insulating film 12 is formed thereon. Then, as illustrated in FIG. 13, the interlayer insulating film is formed over the wires 21, but it is not formed over the area where the wires 21 are not extended. Thus, the interlayer insulating film 12 of the TFT array substrate 10 of the radiation image detector according to the fifth embodiment has a pattern like that shown in FIG. 15.

Figure 15:
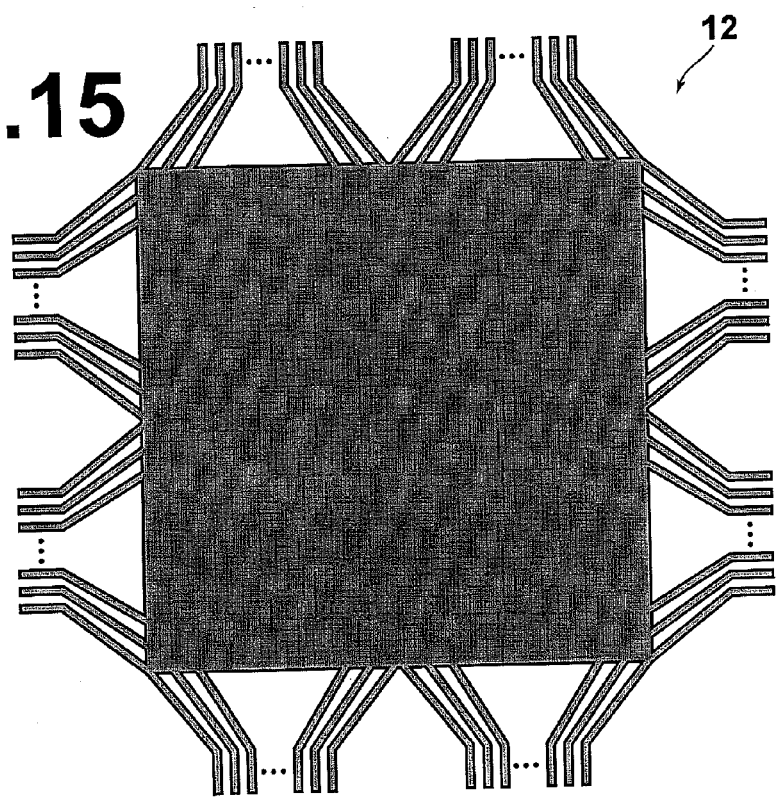
FIG. 15 illustrates an interlayer insulating layer pattern of the TFT array substrate of the radiation image detector according to the fifth embodiment.

In this way, in the radiation image detector of the fifth embodiment, the interlayer insulating film 12 is formed in the pattern shown in FIG. 15, so that the interlayer insulating film 12 is provided for the area where the wires 21 are extended to reduce the voltage impressed on the wires 21, while the interlayer insulating film 12 is not provided for the area where the wires 21 are not extended to allow the TFT array substrate 10, insulating bonding member 25, and the underlayer 20 to be bonded through the inorganic insulating film 19, so that the adhesiveness of the insulating bonding member 25 and the underlayer 20 to the TFT array substrate 10 may be improved. Note that the portion denoted by a grid pattern in FIG. 12 is the contact area of the insulating bonding member 25 with the TFT array substrate 10.

Where the interlayer insulating film 12 is formed through patterning as in the radiation image detector of the fifth embodiment, it is desirable that the contact area of the insulating bonding member 25 with the inorganic insulating film 19 corresponds to 20 to 80%, preferably 25 to 65%, and more preferably about 45% of the contact area of the insulating bonding member 25 with the TFT array substrate 10.

The radiation image detector of the fifth embodiment is a detector in which the wires are extended toward the four sides, as illustrated in FIG. 12. But, also for a radiation image detector in which the wires are extended toward two sides, the interlayer insulating film may be formed over the wires and not over the area where the wires are not extended. In this case, it is desirable that the contact area of the insulating bonding member with the inorganic insulating film corresponds to 50 to 80% of the contact area of the insulating bonding member with the TFT array substrate. In order to balance the adhesiveness, the range may be 25 to 65%, and more preferably about 73%.

Figure 16:
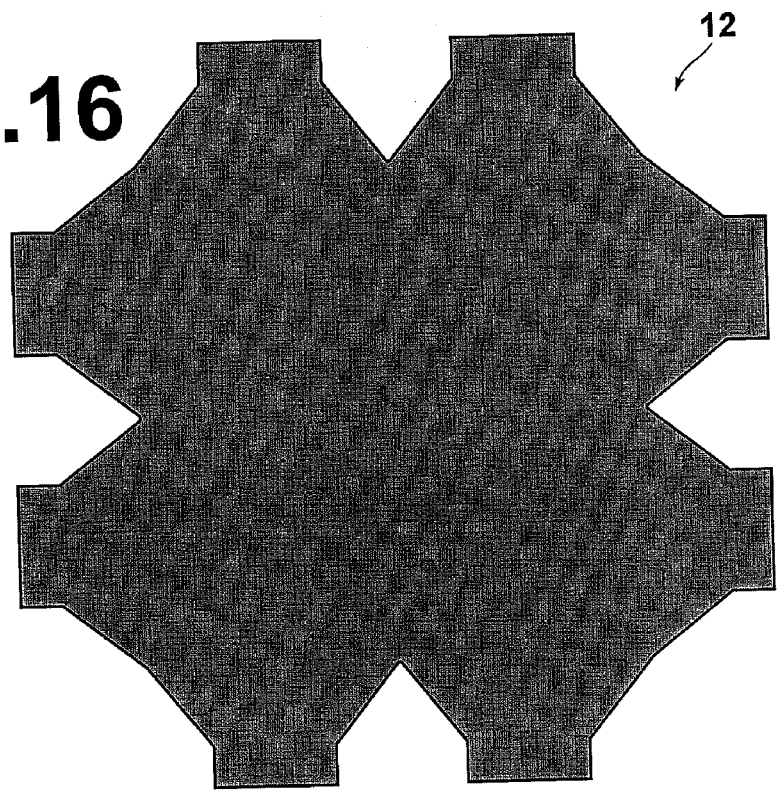
FIG. 16 illustrates an interlayer insulating layer pattern according to another embodiment.
Figure 17:
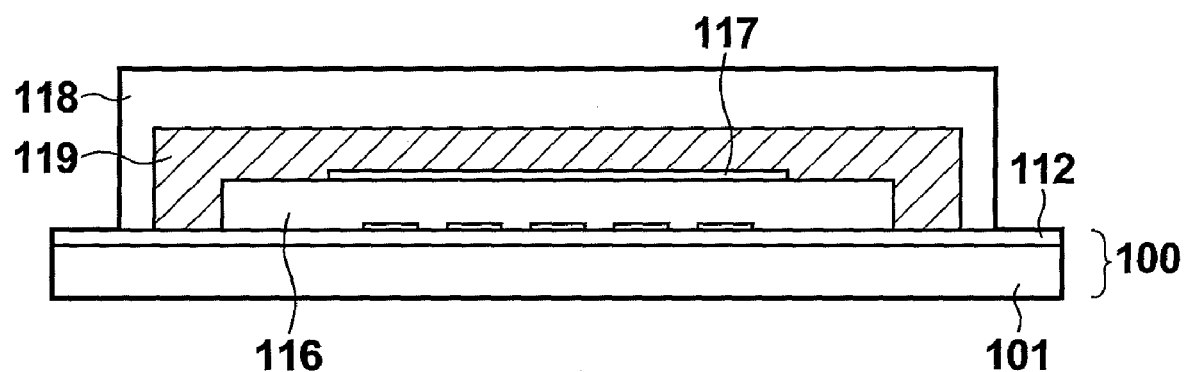
FIG. 17 is a cross-sectional view of a conventional radiation image detector, illustrating a schematic structure thereof.

In the radiation image detector of the fifth embodiment, the interlayer insulating film 12 is provided directly above the wires 21 on the TFT array substrate 10, but where the pitch of the wires is small, the interlayer insulating film 12 maybe formed in a pattern like that shown in FIG. 16 so that the interlayer insulating film 12 is provided over areas adjacent to the wires 21.

In the radiation image detectors according to the embodiments described above, a TFT array substrate having a substrate on which multitudes of TFT switches are disposed is used, but the present invention is also applicable to a radiation image detector with an active matrix substrate having a substrate on which multitudes of switching elements, such as MOS switches, are disposed.

What is claimed is:

1. An image detector comprising:
    an active matrix substrate having a substrate on which multitudes of switching elements are disposed;
    a semiconductor layer which generates charges according to an electromagnetic wave representing image information irradiated thereon and is stacked on the active matrix substrate such that the charges are read out by the active matrix substrate;
    a protection substrate disposed opposite to the active matrix substrate; and
    an insulating bonding member which bonds the protection substrate to the active matrix substrate,
    wherein the insulating bonding member is bonded to the active matrix substrate through an inorganic insulating film disposed in an area around the periphery of the semiconductor layer,
    an organic insulating film is provided on the active matrix substrate, and
    the protection substrate is bonded to the organic insulating film such that the protection substrate contacts the organic insulating film.

2. The image detector as claimed in claim 1, wherein the active matrix substrate includes an organic insulating film having a plurality of openings at a bonding area with the insulating bonding member and the inorganic insulating film is disposed at the openings of the organic insulating film.

3. The image detector as claimed in claim 2, wherein the openings of the organic insulating film are formed such that a contact area of the insulating bonding member with the inorganic insulating film through the openings corresponds to 20 to 80% of a contact area of the insulating bonding member with the active matrix substrate.

4. The image detector as claimed in claim 3, wherein the inorganic insulating film is disposed within the openings between two portions of the organic insulating film such that the inorganic insulating film and the organic insulating film are disposed within a same plane.

5. An image detector as defined in claim 1, wherein the protection substrate is formed by glass.

6. An image detector as defined in claim 1, wherein the material of the protection substrate is the same as the material of the active matrix substrate.

7. An image detector as defined in claim 6, wherein the protection substrate has a same board thickness as a board thickness of the active matrix substrate.

8. An image detector as defined in claim 1, wherein the protection substrate is box shaped, and is provided to cover the upper and side surfaces of the semiconductor layer.

9. An image detector as defined in claim 1, wherein the protection substrate is bonded to the active matrix substrate at an area more toward the exterior thereof than the insulating bonding member.

10. An image detector as defined in claim 1, wherein the insulating bonding member is disposed in contact with an upper surface and side surfaces of the semiconductor layer.

11. An image detector as defined in claim 10, wherein in the insulating bonding member is a one-piece integral construction.

12. An image detector as defined in claim 1, further comprising an electrode disposed between the semiconductor layer and the insulating bonding member such that the electrode is disposed in contact with a portion of an upper surface of the semiconductor layer and disposed in contact with a portion of a lower surface of the insulating bonding member.

13. An image detector as defined in claim 12, wherein the insulating bonding member is disposed in contact with the upper surface and side surfaces of the semiconductor layer.

14. An image detector as defined in claim 13, wherein in the insulating bonding member is a one-piece integral construction.

* * * * *